(12) United States Patent
Matsumoto et al.

(10) Patent No.: US 6,297,517 B1
(45) Date of Patent: Oct. 2, 2001

(54) SEMICONDUCTOR DEVICE AND METHOD OF FABRICATING THE SAME

(75) Inventors: Michikazu Matsumoto, Kyoto; Takehiro Hirai, Shiga, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/688,197

(22) Filed: Oct. 16, 2000

(30) Foreign Application Priority Data

Feb. 28, 2000 (JP) .................................................. 12-050622

(51) Int. Cl.[7] .................................................. H01L 23/58
(52) U.S. Cl. .............................................. 257/48; 257/758
(58) Field of Search ..................................... 257/758, 786, 257/774, 773, 797, 48

(56) References Cited

U.S. PATENT DOCUMENTS 5,923,048 * 7/1999 Inoue ....................................... 257/48
5,942,766 * 8/1999 Frei ......................................... 257/48
6,054,721 * 4/2000 Milor ....................................... 257/48
6,150,669 * 11/2000 Nandakumar et al. ................. 257/48

* cited by examiner

*Primary Examiner*—Roy Potter
(74) *Attorney, Agent, or Firm*—Eric J. Robinson; Nixon Peabody LLP

(57) ABSTRACT

A semiconductor fabrication control monitor includes a first conducting film having a first area, a second area, a third area and a fourth area mutually connected, a first electrode, a second electrode, a third electrode and a fourth electrode all formed on a semiconductor substrate. The first electrode is formed from a second conducting film formed above the first area with an insulating film sandwiched therebetween. The second electrode is formed from the second conducting film formed above the second area with the insulating film sandwiched therebetween. The third electrode is formed from the second conducting film formed above and in direct contact with the third area. The fourth electrode is formed from the second conducting film formed above and in direct contact with the fourth area. The first electrode and the second electrode are mutually connected through a connecting part of the second conducting film, and are electrically connected to the first conducting film.

4 Claims, 15 Drawing Sheets

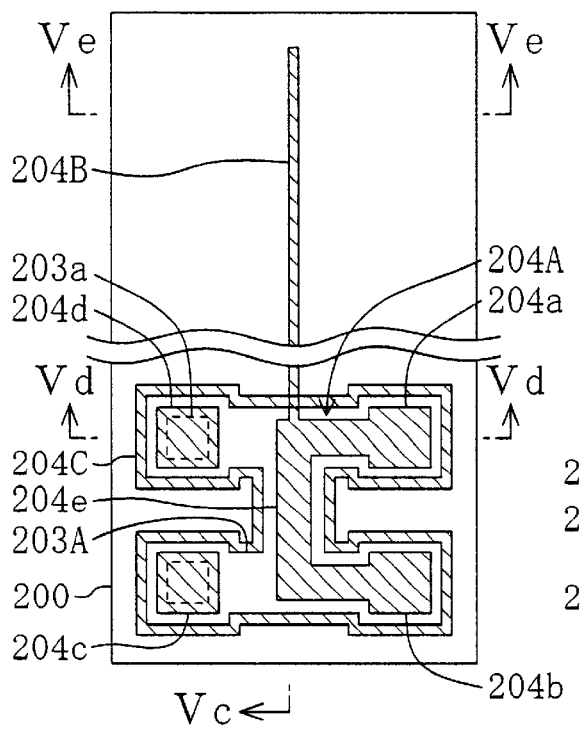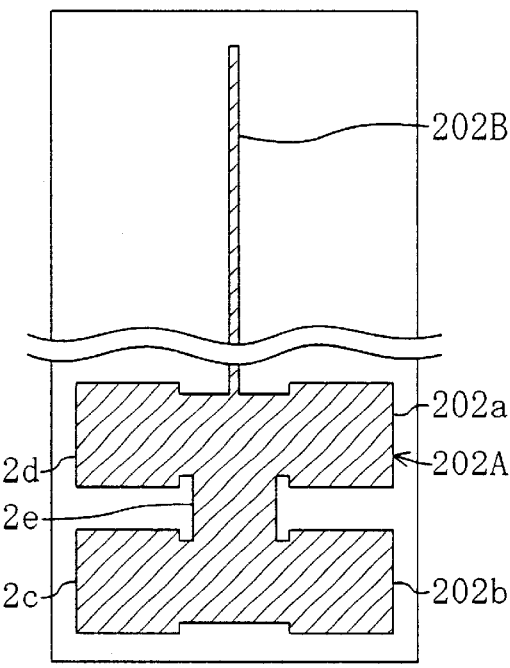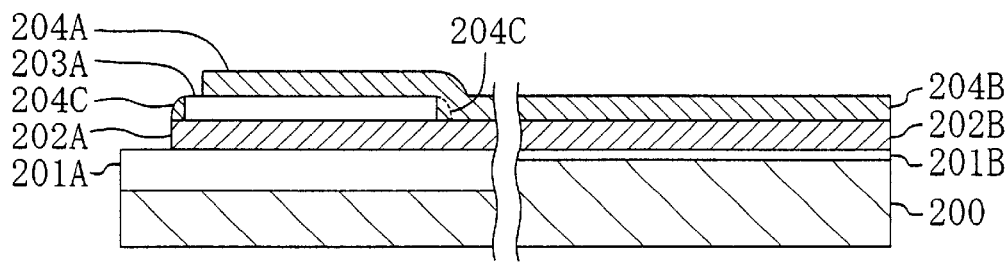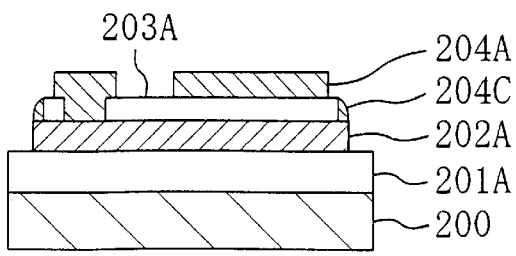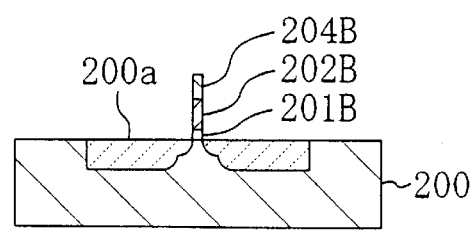

SEMICONDUCTOR DEVICE AND METHOD OF FABRICATING THE SAME

BACKGROUND OF THE INVENTION

The present invention relates to a semiconductor device including a semiconductor fabrication control monitor and a method of fabricating the same.

In accordance with recent improvement in refinement and operation speed of LSIs, there are increasing demands for low resistance of the gate electrode, the source electrode and the drain electrode of a MOS transistor. As one technique to lower the resistance of the gate electrode, a polymetal structure of a laminated structure including a lower polysilicon film and an upper metal film has been proposed for the gate electrode (IEEE Transactions Electron Devices, ED-43, 1864 (1996), etc.).

A metal film used in a gate electrode having the polymetal structure is generally a tungsten film, and the resistance value of the polymetal gate electrode using a tungsten film is approximately 1/10 of that of a silicide ($WSi_x$) film.

In a polymetal gate electrode, it is necessary to form a barrier metal film of tungsten nitride ($WN_x$) or titanium nitride (TiN) between a polysilicon film and a tungsten film in order to prevent an impurity introduced into the polysilicon film from diffusing into the tungsten film. Also, in a polymetal gate electrode, although the resistance value of the metal film can be lowered, there is interface resistance between the metal film and the polysilicon film.

In general, the interface resistance value Rc between the barrier metal film and the polysilicon film after barrier metal deposition is approximately $5 \times 10^{-6}$ $\Omega \cdot cm^2$ in using a tungsten nitride film as the barrier metal film and is approximately $1 \times 10^{-5}$ $\Omega \cdot cm^2$ in using a titanium nitride film as the barrier metal film. When the polymetal gate electrode is subjected to a heat treatment over 750° C. such as a heat treatment for source/drain activation, the interface resistance is increased again.

Accordingly, although the polymetal gate electrode is advantageous in largely lowering the resistance value in use as line resistance, when the interface resistance value is large, the advantage of low line resistance cannot be made use of but the operation speed of the transistor is disadvantageously lowered. In other words, when a MOS transistor is operated with AC (alternate current), distribution capacity generated in a gate insulating film is repeatedly charged and discharged, and hence a current flows through distribution interface resistance, which lowers the operation speed of the MOS transistor. Furthermore, there arises another problem in actual process that the interface resistance is largely increased due to the effect of a heat treatment carried out subsequently.

Accordingly, it is very significant to lower the interface resistance value in a polymetal gate electrode, and in addition, it is very significant from the viewpoint of management of the device fabrication process to measure and control the interface resistance value with a monitor.

Therefore, a semiconductor fabrication control monitor capable of measuring the interface resistance value is constructed in TEG or PCM provided on a scribe line of a semiconductor chip or semiconductor wafer, so as to monitor the interface resistance value. The term "a semiconductor device" is herein used as a concept including TEG, PCM and an actual device.

In conventional process management for the interface resistance value of a polymetal gate electrode, a monitor similar to that used for measuring the contact resistance of a contact hole or a via hole is used.

FIGS. 12(a), 12(b) and 12(c) show a conventional semiconductor fabrication control monitor, wherein FIG. 12(a) shows the plane structure, FIG. 12(b) shows the sectional structure taken on line XIIb—XIIb of FIG. 12(a) and FIG. 12(c) shows an equivalent circuit.

The semiconductor fabrication control monitor shown in FIGS. 12(a) through 12(c) is generally designated as a Kelvin pattern. An insulating film 12 of a silicon oxide film is formed on a semiconductor substrate 11, a polysilicon film 13 is formed on the insulating film 12, a tungsten film 15 is formed on the polysilicon film 13 with an interlayer insulating film 14 sandwiched therebetween, and the polysilicon film 13 and the tungsten film 15 are electrically connected to each other through a contact 16 and a contact 18. As described above, although a barrier metal film of tungsten nitride or titanium nitride is provided between the polysilicon film 13 and the tungsten film 15, a laminated structure including the tungsten film and the barrier metal film is herein designated as the tungsten film 15 for convenience.

In the Kelvin pattern, for example, a constant current I is allowed to flow between a first terminal 1 and a third terminal 3 and a voltage V generated between a second terminal 2 and a fourth terminal 4 is measured, so that the interface resistance value RC in the contact 18 between the polysilicon film 13 and the tungsten film 15 can be calculated by using a relational expression, Rc=V/I.

Now, a method of fabricating the conventional semiconductor fabrication control monitor will be described with reference to FIGS. 13(a) through 13(c), 14(a) through 14(e) and 15(a) through 15(d). FIG. 13(a) shows the plane structure of a first photomask A used for patterning the polysilicon film 13, FIG. 13(b) shows the plane structure of a second photomask B used for forming the contacts 16 and 18 in the interlayer insulating film 14, and FIG. 13(c) shows the plane structure of a third photomask C used for patterning the tungsten film 15.

First, as is shown in FIG. 14(a), after the insulating film 12 of a silicon oxide film is formed on the semiconductor substrate 11, the polysilicon film 13 is deposited on the insulating film 12.

Next, after applying a first resist film on the polysilicon film 13, the first resist film is patterned by using the first photomask A of FIG. 13(a), thereby forming a first resist pattern 17A as is shown in FIG. 14(b). Thereafter, the polysilicon film 13 is subjected to first etching by using the first resist pattern 17A as a mask, thereby patterning the polysilicon film 13 as is shown in FIG. 14(c).

Then, as is shown in FIG. 14(d), the interlayer insulating film 14 is deposited on the entire top surface of the patterned polysilicon film 13, and the interlayer insulating film is planarized.

Next, after applying a second resist film on the planarized interlayer insulating film 14, the second resist film is patterned by using the second photomask B of FIG. 13(b), thereby forming a second resist pattern 17B as is shown in FIG. 14(e). Thereafter, the interlayer insulating film 14 is subjected to second etching by using the second resist pattern 17B as a mask, thereby forming the contact holes 16 and 18 in the interlayer insulating film 14 as is shown in FIG. 15(a).

Then, as is shown in FIG. 15(b), the tungsten film 15 is deposited on the entire top surface of the interlayer insulating film 14.

Subsequently, after applying a third resist film on the tungsten film 15, the third resist film is patterned by using the third photomask C of FIG. 13(c), thereby forming a third resist pattern 19 as is shown in FIG. 15(c). Thereafter, the tungsten film 15 is subjected to third etching by using the third resist pattern 19 as a mask, thereby patterning the tungsten film 15 as is shown in FIG. 15(d). Thus, the conventional semiconductor fabrication control monitor as is shown in FIGS. 12(a) and 12(b) is completed.

The method of fabricating the conventional semiconductor fabrication control monitor, however, has problems that a process largely different from a process for forming a polymetal gate electrode of a transistor is necessary and that three photomasks, namely, the first, second and third photomasks A, B and C, are necessary.

Furthermore, there arises another problem that three etching procedures are required. Specifically, after patterning the polysilicon film 13 by subjecting the polysilicon film 13 to the first etching, the second etching is carried out for forming the contact hole 18 in the interlayer insulating film 14, and thereafter, the tungsten film 15 is patterned by subjecting the tungsten film 15 to the third etching.

Moreover, if the tungsten film 15 is not deposited on the interlayer insulating film 14 after the planarization, a residue of the tungsten film 15 is generated in a step portion of the interlayer insulating film 14 in patterning the tungsten film 15, so that the patterned tungsten film 15 can be short-circuited. Accordingly, the procedure for planarizing the interlayer insulating film 14 is indispensable, resulting in complicating the process.

SUMMARY OF THE INVENTION

In consideration of the aforementioned conventional problems, an object of the invention is fabricating a semiconductor fabrication control monitor through two etching procedures using two kinds of photomasks and making unnecessary planarization of an interlayer insulating film disposed between a lower polysilicon film and an upper metal (tungsten) film.

In order to achieve the aforementioned object, the semiconductor device of this invention comprises a semiconductor fabrication control monitor for measuring a process characteristic of a semiconductor element formed on a semiconductor substrate, and the semiconductor fabrication control monitor includes a first conducting film formed on the semiconductor substrate and having a first area, a second area, a third area and a fourth area mutually connected through a first conducting film connecting part; a first electrode of a second conducting film formed above the first area with an insulating film sandwiched therebetween; a second electrode of the second conducting film formed above the second area with the insulating film sandwiched therebetween; a second conducting film connecting part formed above the first conducting film connecting part with the insulating film sandwiched therebetween for connecting the first electrode and the second electrode; a third electrode of the second conducting film formed above and in direct contact with the third area; and a fourth electrode of the second conducting film formed above and in direct contact with the fourth area, and the first electrode and the second electrode are electrically connected to the first conducting film.

Alternatively, the method of fabricating the aforementioned semiconductor device of this invention comprises a first step of depositing the first conducting film on the semiconductor substrate; a second step of depositing the insulating film on the first conducting film; a third step of allowing the insulating film to remain in an area above the first area, an area above the second area and in an area above the first conducting film connecting part by patterning the insulating film with a first mask pattern used as a mask; a fourth step of depositing the second conducting film on the first conducting film and the patterned insulating film; and a fifth step of forming the first electrode, the second electrode, the third electrode, the fourth electrode and the second conducting film connecting part from the second conducting film and forming the first area, the second area, the third area, the fourth area and the first conducting film connecting part from the first conducting film by patterning the second conducting film with a second mask pattern used as a mask and patterning the first conducting film with the second mask pattern and the patterned insulating film used as masks.

In the semiconductor device and the fabrication method of this invention, the first conducting film is always present under the first, second, third and fourth electrodes formed from the second conducting film, and hence, the insulating film can be deposited on the first conducting film. As a result, a procedure for planarizing the insulating film is not necessary.

Also, since the first conducting film is patterned by using the insulating film patterned by using the first mask pattern and the second mask pattern for use in patterning the second conducting film, the semiconductor fabrication control monitor can be fabricated by using two mask patterns, the first mask pattern and the second mask pattern, namely, two photomasks.

Furthermore, the semiconductor fabrication control monitor can be formed by adding the procedure for depositing the insulating film and the procedure for patterning the insulating film to general semiconductor process. Accordingly, differently from the method of forming the conventional semiconductor fabrication control monitor, the semiconductor fabrication control monitor can be formed by adding merely few procedures to the general semiconductor process.

In the semiconductor device of this invention, it is preferred that the first conducting film is a polysilicon film doped with an impurity, that the second conducting film is a metal film, and that the semiconductor device further includes a gate electrode formed from a laminated structure including the first conducting film and the second conducting film.

Also, in the method of fabricating the semiconductor device of this invention, it is preferred that the first conducting film is a polysilicon film doped with an impurity, that the second conducting film is a metal film, and that the fifth step includes a sub-step of forming a gate electrode from a laminated structure including the first conducting film and the second conducting film.

In this manner, the semiconductor fabrication control monitor and the gate electrode can be formed through etching using the same mask patterns. Accordingly, the semiconductor fabrication control monitor can be formed by adding merely few procedures to the fabrication process for a semiconductor device including a MOSFET.

BRIEF DESCRIPTION OF THE DRAWINGS

FIG. 5(a) is a plan view of a semiconductor device according to Embodiment 2 of the invention;

FIG. 5(b) is a plan view of a patterned polysilicon film included in the semiconductor device of Embodiment 2;

FIG. 5(c) is a cross-sectional view taken on line Vc—Vc of FIG. 5(a);

FIG. 5(d) is a cross-sectional view taken on line Vd—Vd of FIG. 5(a);

FIG. 5(e) is a cross-sectional view taken on line Ve—Ve of FIG. 5(a);

DETAILED DESCRIPTION OF THE INVENTION

EMBODIMENT 1

Figure 1A:
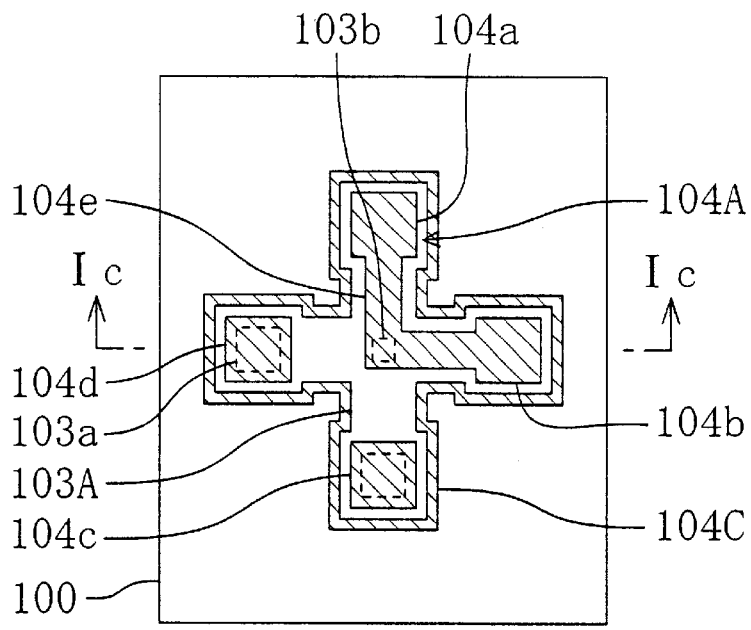
FIG. 1(a) is a plan view of a semiconductor device according to Embodiment 1 of the invention.
Figure 1B:
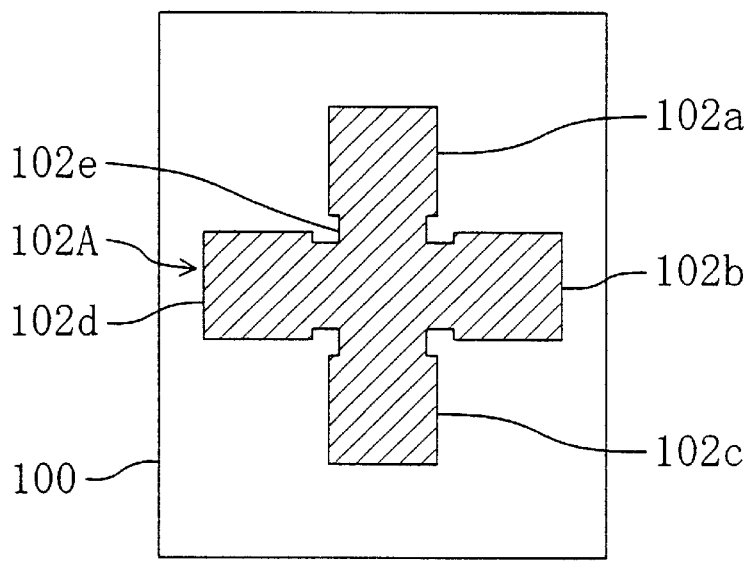
FIG. 1(b) is a plan view of a patterned polysilicon film included in the semiconductor device of Embodiment 1.

A semiconductor device according to Embodiment 1 of the invention will now be described with reference to FIGS. 1(a) through 1(c). FIG. 1(a) shows the plane structure of a semiconductor fabrication control monitor, FIG. 1(b) shows the plane structure of a polysilicon film 102A included in the semiconductor fabrication control monitor, and FIG. 1(c) shows the sectional structure taken on line Ic—Ic of FIG. 1(a).

Figure 1C:
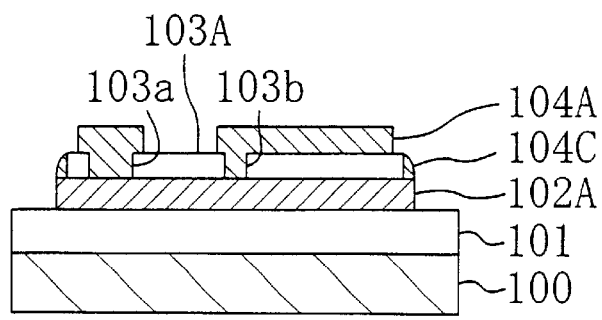
FIG. 1(c) is a cross-sectional view taken on line Ic—Ic of FIG. 1(a)

As is shown in FIGS. 1(a) and 1(c), the patterned polysilicon film 102A serving as a first conducting film is formed on a semiconductor substrate 100 with a first insulating film 101 sandwiched therebetween. As is shown in FIG. 1(b), the patterned polysilicon film 102A has a first area 102a, a second area 102b, a third area 102c, a fourth area 102d, and a first conducting film connecting part 102e in the shape of a cross for mutually connecting the first, second, third and fourth areas 102a, 102b, 102c and 102d.

On the patterned polysilicon film 102A, a patterned second insulating film 103A having a slightly smaller plane shape than the polysilicon film 102A is formed. The patterned second insulating film 103A has openings 103a on the third area 102c and the fourth area 102d, respectively, and has a contact hole 103b on the first conducting film connecting part 102e. On the patterned second insulating film 103A, a patterned tungsten film 104A serving as a second conducting film is formed.

The patterned tungsten film 104A has a first electrode 104a formed above the first area 102a with the second insulating film 103A sandwiched therebetween; a second electrode 104b formed above the second area 102b with the second insulating film 103A sandwiched therebetween; a third electrode 104c formed above the third area 102c with the second insulating film 103A sandwiched therebetween and in contact with the third area 102c through the opening 103a; a fourth electrode 104d formed above the fourth area 102d with the second insulating film 103A sandwiched therebetween and in contact with the fourth area 102d through the opening 103a; and a second conducting film connecting part 104e formed above the first conducting film connecting part 102e with the second insulating film 103A sandwiched therebetween and in contact with the first conducting film connecting part 102e through the contact hole 103b.

On a portion of the polysilicon film 102A around the second insulating film 103A, a sidewall 104C of a tungsten film is formed.

The first area 102a, the second area 102b, the third area 102c, the fourth area 102d and the first conducting film connecting part 102e formed from the first conducting film 102A, and the first electrode 104a, the second electrode 104b, the third electrode 104c, the fourth electrode 104d and the second conducting film connecting part 104e formed from the second conducting film 104A described above together form the semiconductor fabrication control monitor having a Kelvin pattern.

In the semiconductor fabrication control monitor of Embodiment 1, a constant current is allowed to flow between the first electrode 104a and the third electrode 104c, and a value of a voltage generated between the second electrode 104b and the fourth electrode 104d is measured, so as to calculate an interface resistance value in the contact hole 103b between the polysilicon film 102A and the tungsten film 104A by using a relational expression, an interface resistance value=(a measured voltage value)/(a current value of the constant current).

Now, a method of fabricating the semiconductor device of Embodiment 1 will be described with reference to FIGS. 2(a), 2(b), 3(a) through 3(c) and 4(a) through 4(c).

Figure 3A:
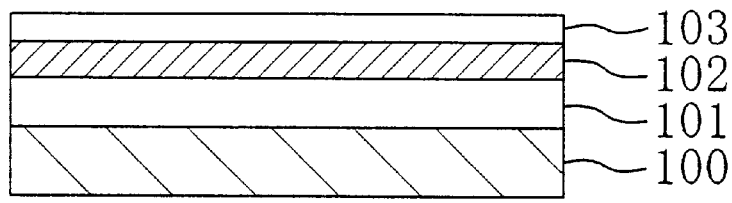
FIGS. 3(a), 3(b) and 3(c) are cross-sectional views for showing procedures in a method of fabricating the semiconductor device of Embodiment 1.

First, as is shown in FIG. 3(a), a polysilicon film 102 serving as the first conducting film is deposited on the semiconductor substrate 100 with the first insulating film 101 sandwiched therebetween, and a second insulating film 103 is deposited on the polysilicon film 102.

Figure 2A:
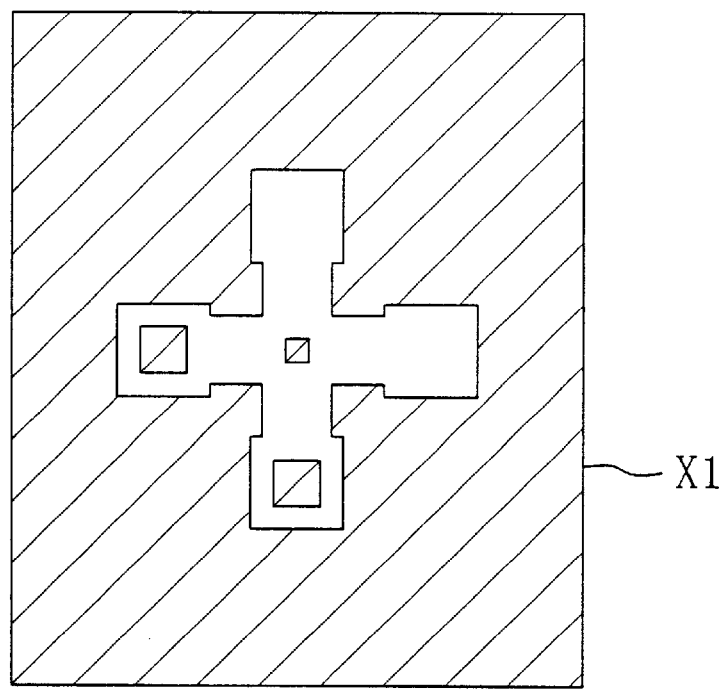
FIG. 2(a) is a plan view of a first photomask used for fabricating the semiconductor device of Embodiment 1.
Figure 3B:
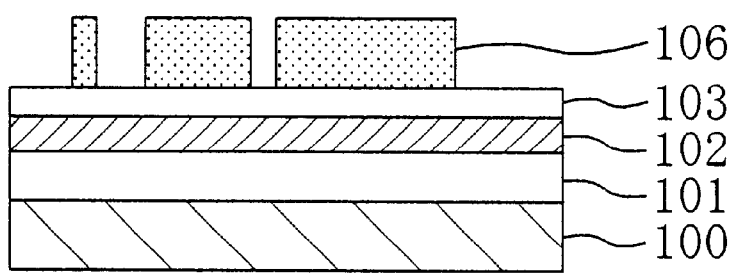

Next, after applying a first resist film on the second insulating film 103, the pattern of a first photomask X1 of FIG. 2(a) is transferred onto the first resist film and the first resist film is then developed, thereby forming a first resist pattern 106 corresponding to a first mask pattern as is shown in FIG. 3(b).

Figure 3C:
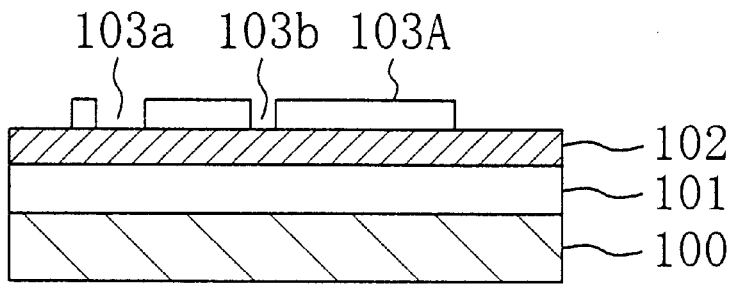

Then, the second insulating film 103 is etched by using the first resist pattern 106 as a mask, thereby forming the patterned second insulating film 103A as is shown in FIG. 3(c). The patterned second insulating film 103A has the openings 103a on the third area 102c and the fourth area 102d, respectively, and has the contact hole 103b on the first conducting film connecting part 102e (as shown in FIG. 1(a)).

Figure 4A:
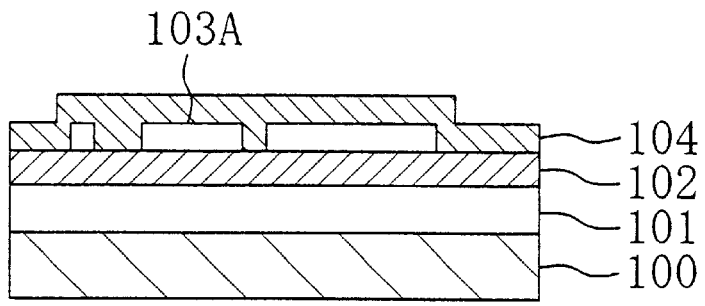
FIGS. 4(a), 4(b) and 4(c) are cross-sectional views or showing other procedures in the method of fabricating the semiconductor device of Embodiment 1.

Subsequently, as is shown in FIG. 4(a), a tungsten film 104 serving as the second conducting film is deposited on the patterned second insulating film 103A.

Figure 2B:
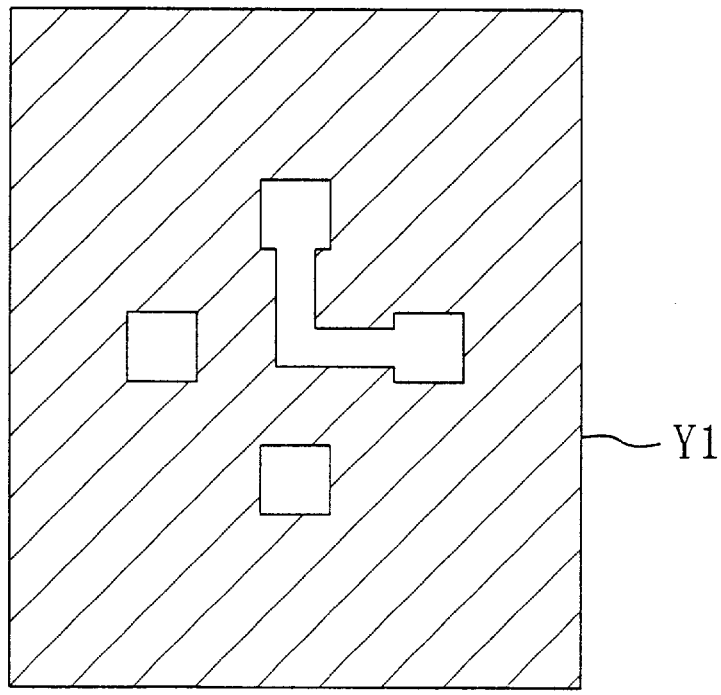
FIG. 2(b) is a plan view of a second photomask used for fabricating the semiconductor device of Embodiment 1.
Figure 4B:
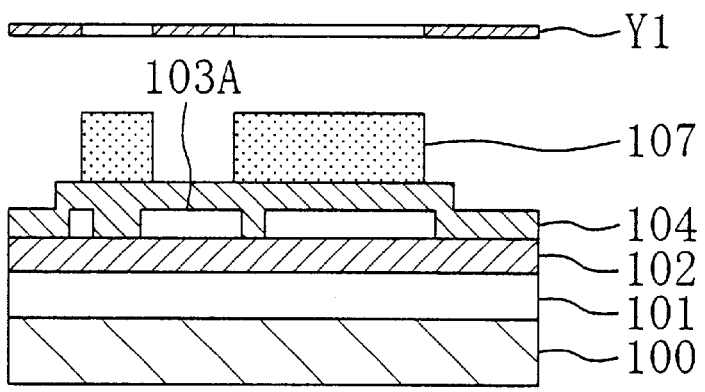

Next, after applying a second resist film on the tungsten film 104, the pattern of a second photomask Y1 of FIG. 2(b) is transferred onto the second resist film and the second resist film is then developed, thereby forming a second resist pattern 107 corresponding to a second mask pattern as is shown in FIG. 4(b).

Figure 4C:
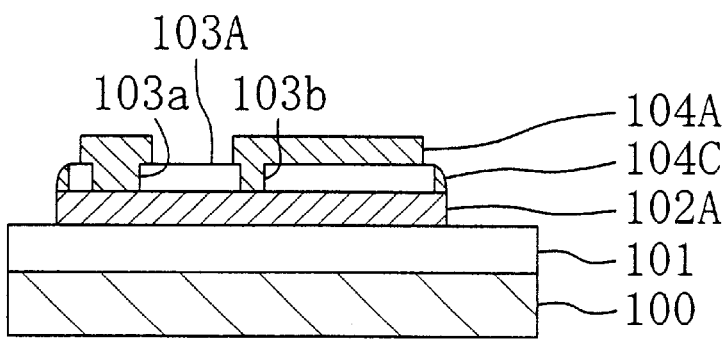

Then, the tungsten film 104 is etched by using the second resist pattern 107 as a mask, thereby forming the patterned tungsten film 104A as is shown in FIG. 4(c). Also, the polysilicon film 102 is etched by using the second resist pattern 107 and the patterned second insulating film 103A as masks, thereby forming the patterned polysilicon film 102A as is shown in FIG. 4(c).

In this manner, the patterned polysilicon film 102A having the first area 102a, the second area 102b, the third area 102c, the fourth area 102d and the first conducting film connecting part 102e (as shown in FIG. 1(b)) and the patterned tungsten film 104A having the first electrode 104a, the second electrode 104b, the third electrode 104c, the fourth electrode 104d and the second conducting film connecting part 104e (as shown in FIG. 1(a)) can be obtained.

In Embodiment 1, the patterned tungsten film 104A is formed by etching the tungsten film 104 with the second resist pattern 107 used as a mask, and the patterned polysilicon film 102A is formed by etching the polysilicon film 102 with the second resist pattern 107 and the patterned second insulating film 103A used as masks. In other words, the patterned tungsten film 104A and the pattern polysilicon film 102A are formed by using the first resist pattern 106 and the second resist pattern 107. Accordingly, the semiconductor device including the semiconductor fabrication control monitor can be fabricated by using two photomasks, that is, the first photomask X1 and the second photomask Y1.

Furthermore, in Embodiment 1, the semiconductor fabrication control monitor can be fabricated by merely adding the procedures for depositing the second insulating film 103 and patterning the second insulating film 103 between the procedure for depositing the polysilicon film 102 and doping the polysilicon film 102 with an impurity and the procedure for depositing the tungsten film 104, which are indispensable for a general semiconductor process flow. In other words, differently from the method of fabricating the conventional semiconductor fabrication control monitor, the semiconductor fabrication control monitor of this embodiment can be fabricated by adding merely few procedures to the general semiconductor process.

Moreover, in the fabrication process for a semiconductor device including an analog circuit, the procedures for depositing the second insulating film 103 serving as an interlayer insulating film and for patterning the second insulating film 103 are generally necessary. In other words, in the case where a resistor of the polysilicon film 102 and a capacity element including a bottom electrode of the polysilicon film 102, a dielectric insulating film of the second insulating film 103 and a top electrode of the tungsten film 104 are formed in an analog circuit, the procedures for depositing the second insulating film 103 and patterning the second insulating film 103 are generally necessary.

Accordingly, when the method of Embodiment 1 is employed simultaneously with the fabrication process for a semiconductor device including an analog circuit, the semiconductor fabrication control monitor can be fabricated on a semiconductor substrate where the analog circuit is to be formed without conducting any additional procedure.

Furthermore, in Embodiment 1, the first electrode 104a, the second electrode 104b, the third electrode 104c and the fourth electrode 104d formed from the patterned tungsten film 104A are respectively formed on the first area 102a, the second area 102b, the third area 102c and the fourth area 102d formed from the patterned polysilicon film 102A with the second insulating film 103A sandwiched therebetween. In other words, the polysilicon film 102A is always present under the first, second, third and fourth electrodes 104a, 104b, 104c and 104d. Accordingly, the second insulating film 103A is plane, and hence, there is no need to conduct a procedure for planarizing the second insulating film 103A.

In Embodiment 1, a barrier metal film of tungsten nitride or titanium nitride is disposed between the polysilicon film 102 (the patterned polysilicon film 102A) and the tungsten film 104 (the patterned tungsten film 104A), but a laminated structure including the tungsten film and the barrier metal film is herein designated as the tungsten film 104 or the patterned tungsten film 104A for convenience.

Embodiment 2

A semiconductor device according to Embodiment 2 of the invention will now be described with reference to FIGS. 5(a) through 5(e). The semiconductor device of Embodiment 2 is a semiconductor fabrication control monitor close to the gate electrode of an actual MOS transistor. FIG. 5(a) shows the plane structure of the semiconductor fabrication control monitor and the gate electrode, FIG. 5(b) shows the plane structure of a polysilicon film 202A included in the semiconductor fabrication control monitor, FIG. 5(c) shows the sectional structure taken on line Vc—Vc of FIG. 5(a), FIG. 5(d) shows the sectional structure taken on line Vd—Vd of FIG. 5(a) and FIG. 5(e) shows the sectional structure taken on line Ve—Ve of FIG. 5(a). In each of FIGS. 5(a) and 5(b), a portion above a break line corresponds to an area for the gate electrode, and in FIG. 5(c), a portion on the right hand side of a break line corresponds to the area for the gate electrode.

As is shown in FIGS. 5(a), 5(c), 5(d) and 5(e), the patterned polysilicon film 202A serving as a first conducting film included in the semiconductor fabrication control monitor is formed on a semiconductor substrate 200 with a first insulating film 201A sandwiched therebetween, and a polysilicon film 202B serving as a bottom gate electrode is formed on the semiconductor substrate 200 with a gate insulating film 201B sandwiched therebetween.

As is shown in FIG. 5(b), the patterned polysilicon film 202A included in the semiconductor fabrication control monitor has a first area 202a, a second area 202b, a third area 202c, a fourth area 202d and a first conducting film connecting part 202e in the shape of an H for mutually connecting the first, second, third and fourth areas 202a, 202b, 202a and 202d.

On the patterned polysilicon film 202A, a patterned second insulating film 203A having a slightly smaller plane shape than the polysilicon film 202A is formed. The patterned second insulating film 203A has openings 203a on the third area 202c and the fourth area 202d, respectively.

On the patterned second insulating film 203A, a patterned tungsten film 204A serving as a second conducting film is formed, and on the polysilicon film 202B serving as the bottom gate electrode, a tungsten film 204B serving as a top gate electrode is formed.

The patterned tungsten film 204A included in the semiconductor fabrication control monitor has a first electrode 204a formed above the first area 202a with the second insulating film 203A sandwiched therebetween; a second electrode 204b formed above the second area 202b with the second insulating film 203A sandwiched therebetween; a third electrode 204c formed above the third area 202c with the second insulating film 203A sandwiched therebetween and in contact with the third area 202a through the opening 203a; a fourth electrode 204d formed above the fourth area 202c with the second insulating film 203A sandwiched therebetween and in contact with the fourth area 202d through the opening 203a; and a second conducting film connecting part 204e formed above the first conducting film connecting part 202e with the second insulating film 203A sandwiched therebetween.

On a portion of the polysilicon film 202A around the second insulating film 203A, a sidewall 204C of a tungsten film is formed.

The first area 202a, the second area 202b, the third area 202c, the fourth area 202d and the first conducting film connecting part 202e formed from the first conducting film 202A, and the first electrode 204a, the second electrode 204b, the third electrode 204a, the fourth electrode 204d and the second conducting film connecting part 204e formed from the second conducting film 204A together form the semiconductor fabrication control monitor having the Kelvin pattern. The polysilicon film 202B and the tungsten film 204B together form the gate electrode.

In the semiconductor fabrication control monitor of this embodiment, a constant current is allowed to flow between the first electrode 204a and the third electrode 204c, and a value of a voltage generated between the second electrode 204b and the fourth electrode 204d is measured, so as to calculate an interface resistance value between the polysilicon film 202B and the tungsten film 204B included in the gate electrode by using a relational expression, an interface resistance value=(a measure voltage value)/(a current value of the constant current).

Now, a first method of fabricating the semiconductor device of Embodiment 2 will be described with reference to FIGS. 6(a), 6(b), 7(a) through 7(c) and 8(a) through 8(c).

Figure 7A:
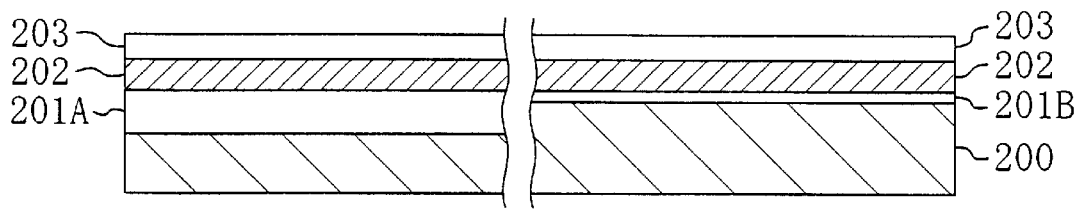
FIGS. 7(a), 7(b) and 7(c) are cross-sectional views for showing procedures in a first method of fabricating the semiconductor device of Embodiment 2.

First, as is shown in FIG. 7(a), the first insulating film 201A with a relatively large thickness is formed on the semiconductor substrate 200 in an area for the semiconductor fabrication control monitor, and the first insulating film 201B with a relatively small thickness is formed on the semiconductor substrate 200 in the area for the gate electrode. Then, a polysilicon film 202 serving as the first conducting film is deposited on the entire top surfaces of the first insulating films 201A and 201B. Thereafter, a second insulating film 203 is deposited on the polysilicon film 202.

Figure 6A:
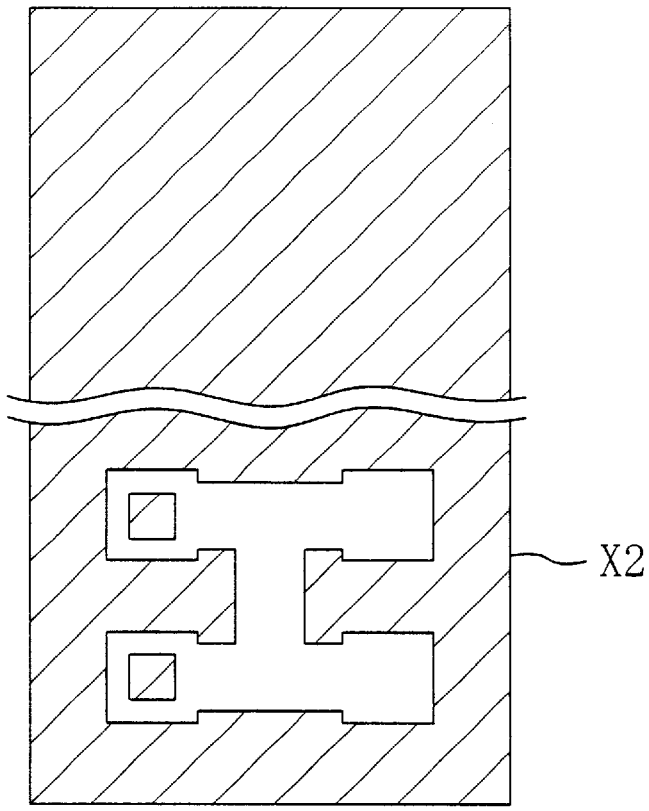
FIG. 6(a) is a plan view of a first photomask used for fabricating the semiconductor device of Embodiment 2.
Figure 7B:
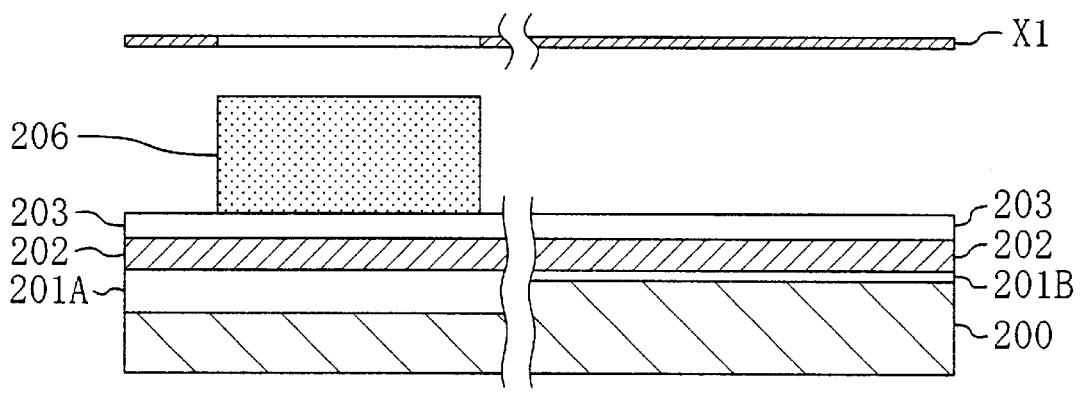
Figure 7C:
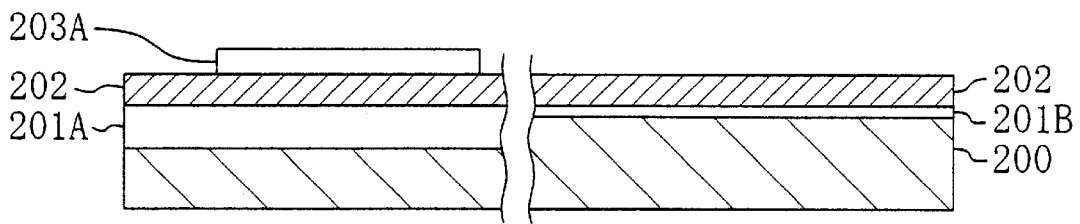

Next, after applying a first resist film on the second insulating film 203, the pattern of a first photomask X2 of FIG. 6(a) is transferred onto the first resist film, and the first resist film is then developed, thereby forming a first resist pattern 206 as is shown in FIG. 7(b).

Figure 8A:
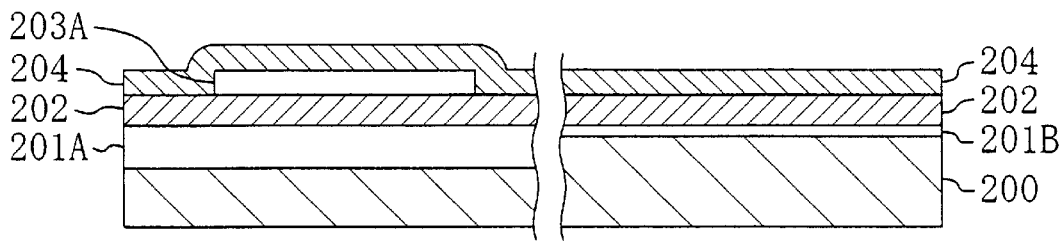
FIGS. 8(a), 8(b) and 8(c) are cross-sectional views for showing other procedures in the first method of fabricating the semiconductor device of Embodiment 2.
Figure 8B:
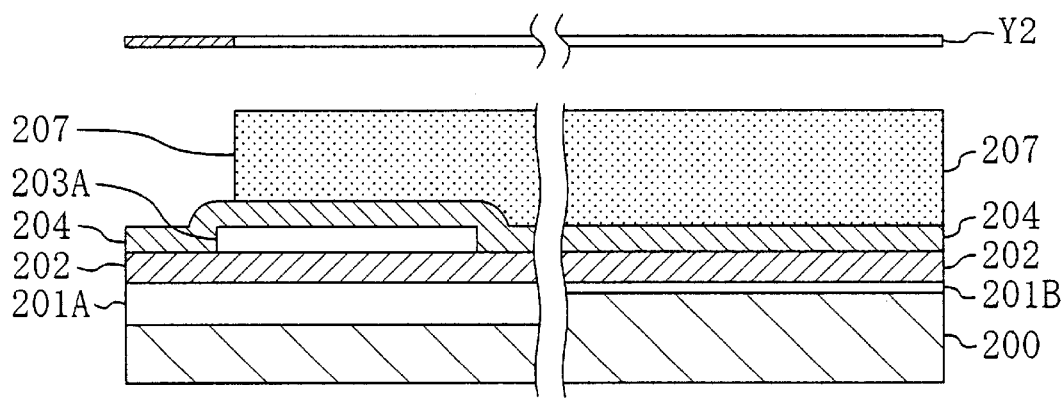
Figure 8C:
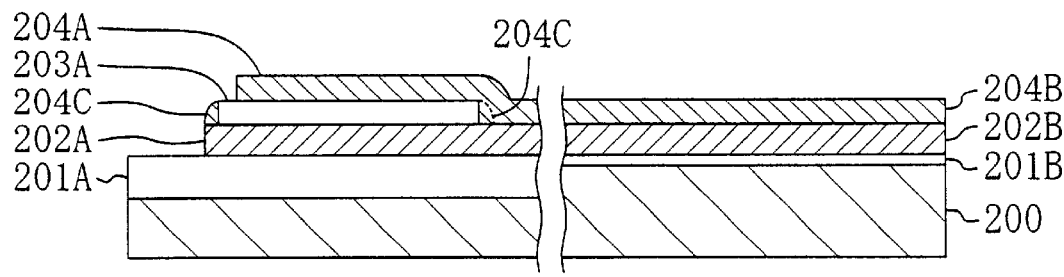

Then, the second insulating film 203 is subjected to anisotropic dry etching by using the first resist pattern 206 as a mask, thereby forming the patterned second insulating film 203A as shown in FIG. 8(c). The patterned second insulating film 203A has the openings 203a on the third area 202c and the fourth area 202d, respectively (as shown in FIG. 5(a)).

Subsequently, as is shown in FIG. 8(a), a tungsten film 204 serving as the second conducting film is deposited on the patterned second insulating film 203A in the area for the semiconductor fabrication control monitor and on the polysilicon film 202 in the area for the gate electrode.

Figure 6B:
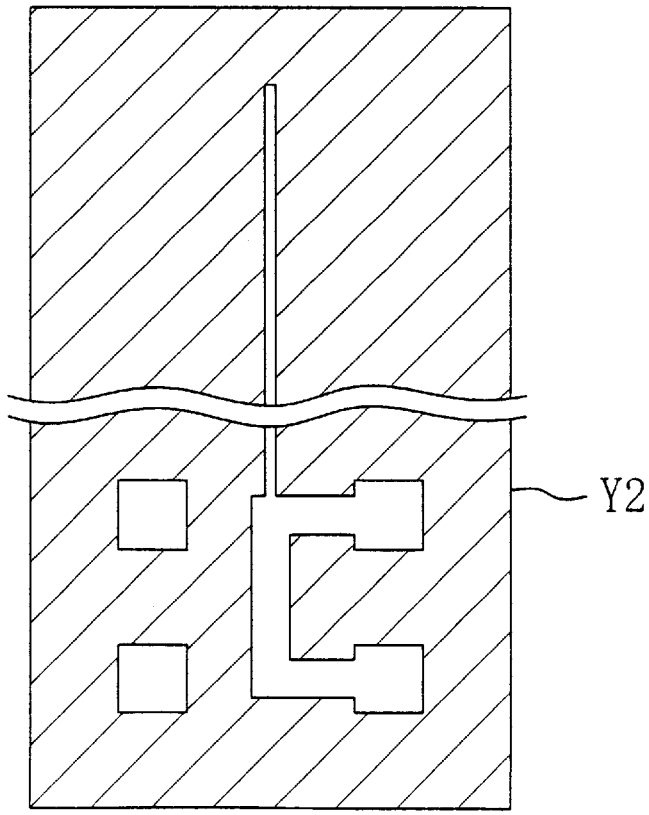
FIG. 6(b) is a plan view of a second photomask used for fabricating the semiconductor device of Embodiment 2.

Next, after applying a second resist film on the tungsten film 204, the pattern of a second photomask Y2 of FIG. 6(b) is transferred onto the second resist film, and the second resist film is then developed, thereby forming a second resist pattern 207 as is shown in FIG. 8(b).

Then, in the area for the semiconductor fabrication control monitor, the tungsten film 204 is etched by using the second resist pattern 207 as a mask, thereby forming the patterned tungsten film 204A as is shown in FIG. 8(c). Also, the polysilicon film 202 is etched by using the second resist pattern 207 and the patterned second insulating film 203A as masks, thereby forming the patterned polysilicon film 202A as is shown in FIG. 8(c). In this manner, the patterned polysilicon film 202A having the first area 202a, the second area 202b, the third area 202c, the fourth area 202d and the first conducting film connecting part 202e (as shown in FIG. 5(b)) and the patterned tungsten film 204A having the first electrode 204a, the second electrode 204b, the third electrode 204c, the fourth electrode 204d and the second conducting film connecting part 204e (as shown in FIG. 5(a)) can be obtained.

On the other hand, in the area for the gate electrode, the tungsten film 204 and the polysilicon film 202 are etched by using the second resist pattern 207, thereby forming the tungsten film 204B serving as the top gate electrode and the polysilicon film 202B serving as the bottom gate electrode as shown in FIG. 8(c).

In Embodiment 2, the semiconductor device including the semiconductor fabrication control monitor can be fabricated by using two photomasks, that is, the first photomask X2 and the second photomask Y2.

Also, in Embodiment 2, the semiconductor fabrication control monitor can be fabricated by merely adding the procedures for depositing the second insulating film 203 and patterning the second insulating film 203 between the procedure for depositing the polysilicon film 202 and doping the polysilicon film 202 with an impurity and the procedure for depositing the tungsten film 204, which are indispensable for the general semiconductor process flow.

Accordingly, in Embodiment 2, the Kelvin pattern is formed under conditions closer to those for the gate electrode of an actual MOS transistor as TEG, so that the interface resistance value of the gate electrode can be measured with the Kelvin pattern. In addition, it is possible to fabricate a semiconductor device in which an actual MOS transistor and a semiconductor fabrication control monitor are formed on the same semiconductor substrate 200.

Now, a second method of fabricating the semiconductor device of Embodiment 2 will be described with reference to FIGS. 9(a) through 9(c).

Figure 9A:
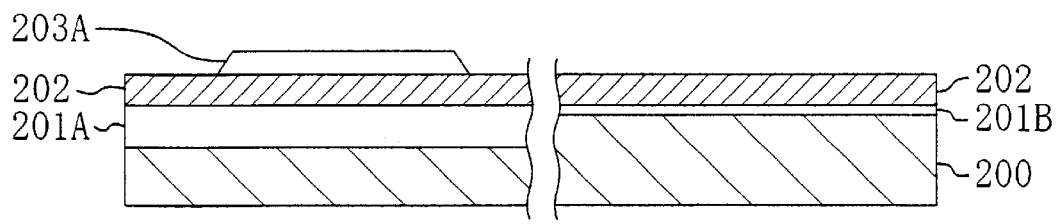
FIGS. 9(a), 9(b) and 9(c) are cross-sectional views for showing procedures in a second method of fabricating the semiconductor device of Embodiment 2.

In the same manner as in the first method, after forming the first resist pattern 206 on the second insulating film 203 (as shown in FIG. 7(b)), the second insulating film 203 is subjected to wet etching by using the first resist pattern 206 as a mask, thereby forming the patterned second insulating film 203A in a tapered shape as is shown in FIG. 9(a).

Figure 9B:
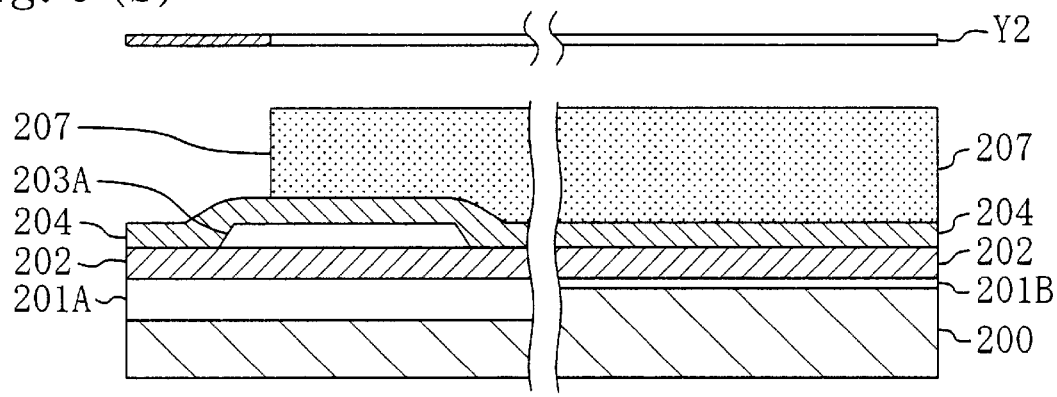

Next, as is shown in FIG. 9(b), the tungsten film 204 serving as the second conducting film is deposited on the patterned second insulating film 203A in the area for the semiconductor fabrication control monitor and on the polysilicon film 202 in the area for the gate electrode, and the second resist pattern 207 is formed on the tungsten film 204.

Figure 9C:
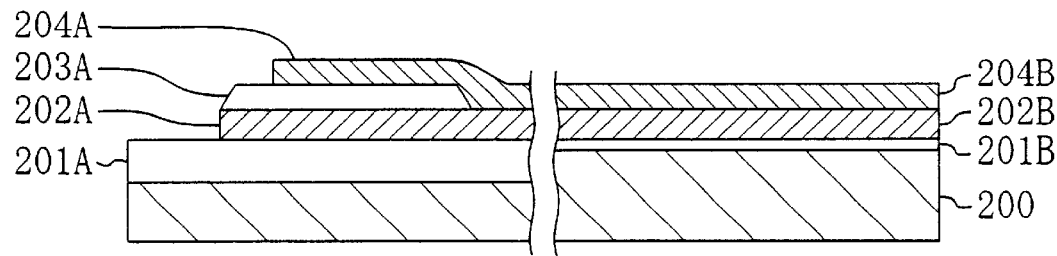

Then, in the area for the semiconductor fabrication control monitor, the tungsten film 204 is etched by using the second resist pattern 207 as a mask, thereby forming the patterned tungsten film 204A as is shown in FIG. 9(c). Also, the polysilicon film 202 is etched by using the second resist pattern 207 and the patterned second insulating film 203A as masks, thereby forming the patterned polysilicon film 202A as is shown in FIG. 9(c).

On the other hand, in the area for the gate electrode, the tungsten film 204 and the polysilicon film 202 are etched by using the second resist pattern 207 as a mask, thereby forming the tungsten film 204B serving as the top gate electrode and the polysilicon film 202B serving as the bottom gate electrode as is shown in FIG. 9(c).

In the second fabrication method, since the patterned second insulating film 203A is in the tapered shape, the tungsten film 204 is deposited in a tapered shape on the side face of the patterned second insulating film 203A. Therefore, when the tungsten film 204 is etched by using the second resist pattern 207 as a mask, no sidewall 203C is formed on the side face of the patterned second insulating film 203A as is understood from comparison between FIGS. 8(c) and 9(c).

Accordingly, the gate electrode is not electrically connected to the sidewall 203C, and hence, it is possible to definitely avoid a problem that the interface resistance value cannot be measured due to pattern short-circuit.

In the second fabrication method, although the patterned second insulating film 203A in the tapered shape is formed by wet etching the second insulating film 203, the patterned second insulating film 203A in the tapered shape can be formed by conducting isotropic dry etching on the second insulating film 203 instead.

Furthermore, in Embodiment 2, a barrier metal film of tungsten nitride or titanium nitride is disposed between the polysilicon film 202 (the patterned polysilicon film 202A or the polysilicon film 202B serving as the bottom gate electrode) and the tungsten film 204 (the patterned tungsten film 204A or the tungsten film 204B serving as the top gate electrode), but a laminated structure including the tungsten film and the barrier metal film is herein designated as the tungsten film 204, the patterned tungsten film 204A or the tungsten film 204B serving as the top gate electrode for convenience.

Embodiment 3

Figure 10A:
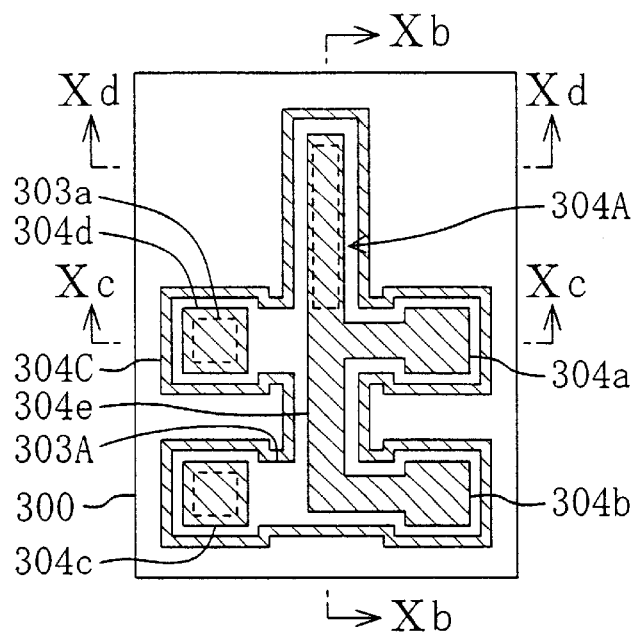
FIG. 10(a) is a plan view of a semiconductor device according to Embodiment 3 of the invention.
Figure 10B:
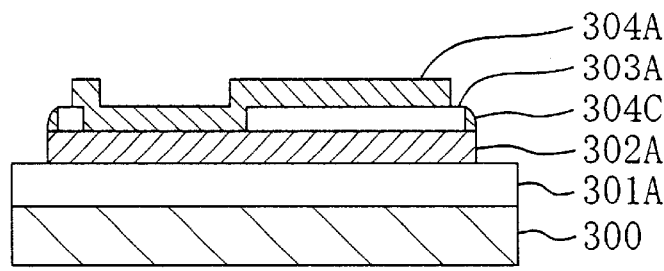
FIG. 10(b) is a cross-sectional view taken on line Xb—Xb of FIG. 10(a)
Figure 10C:
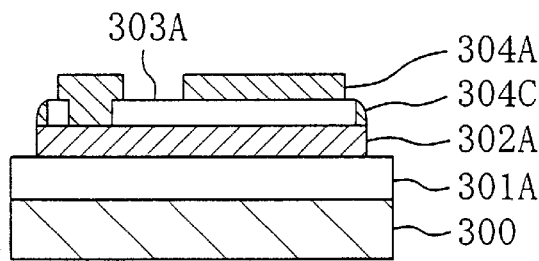
FIG. 10(c) is a cross-sectional view taken on line Xc—Xc of FIG. 10(a)
Figure 10D:
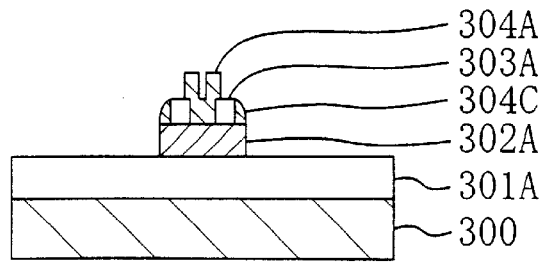
FIG. 10(d) is a cross-sectional view taken on line Xd—Xd of FIG. 10(a)

A semiconductor device and a method of fabricating the semiconductor device according to Embodiment 3 will now be described with reference to FIGS. 10(a) through 10(d), 11(a) and 11(b). FIG. 10(a) shows the plane structure of a semiconductor fabrication control monitor, FIG. 10(b) shows the sectional structure taken on line Xb—Xb of FIG. 10(a), FIG. 10(c) shows the sectional structure taken on line Xc—Xc of FIG. 10(a) and FIG. 10(d) shows the sectional structure taken on line Xd—Xd of FIG. 10(a). A portion projecting upward in FIG. 10(a) and FIG. 10(d) show an area for a gate electrode.

As is shown in FIGS. 10(a) through 10(d), a patterned polysilicon film 302A serving as a first conducting film is formed on a semiconductor substrate 300 with a first insulating film 301A sandwiched therebetween. Although not shown in the drawings, the patterned polysilicon film 302A has a first area, a second area, a third area, a fourth area and a first conducting film connecting part in the shape of an H, and serves as a bottom gate electrode in the area for the gate electrode as in Embodiment 2.

On the patterned polysilicon film 302A, a patterned second insulating film 303A having a slightly smaller plane shape than the polysilicon film 302A is formed, and the second insulating film 303A has openings 303a on the third area and the fourth area of the polysilicon film 302A, respectively.

Furthermore, on the patterned second insulating film 303A, a patterned tungsten film 304A is formed, and the tungsten film 304A has, as in Embodiment 2, a first electrode 304a formed above the first area of the polysilicon film 302A with the second insulating film 303A sandwiched therebetween; a second electrode 304b formed above the second area of the polysilicon film 302A with the second insulating film 303A sandwiched therebetween; a third electrode 304c formed above the third area of the polysilicon film 302A with the second insulating film 303A sandwiched therebetween and in contact with the third area through the opening 303a; a fourth electrode 304d formed above the fourth area of the polysilicon film 302A with the second insulating film 303A sandwiched therebetween and in contact with the fourth area through the opening 303a; and a second conducting film connecting part 304e formed above the first conducting film connecting part of the polysilicon film 302A with the second insulating film 303A sandwiched therebetween.

In the area for the gate electrode, on the polysilicon film 302A serving as the bottom gate electrode, the patterned second insulating film 303A having a slightly smaller plane shape than the polysilicon film 302A and having an opening at the center is formed. In addition, the tungsten film 304A serving as the top gate electrode is formed on the second insulating film 303A, and the tungsten film 304A is in contact with the polysilicon film 302A serving as the bottom gate electrode through the opening of the second insulating film 303A.

Figure 11A:
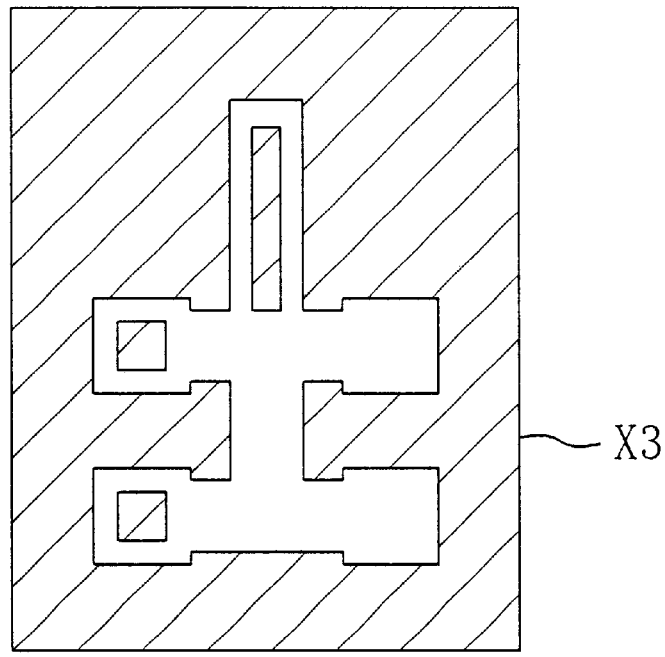
FIG. 11(a) is a plan view of a first photomask used for fabricating the semiconductor device of Embodiment 3.
Figure 11B:
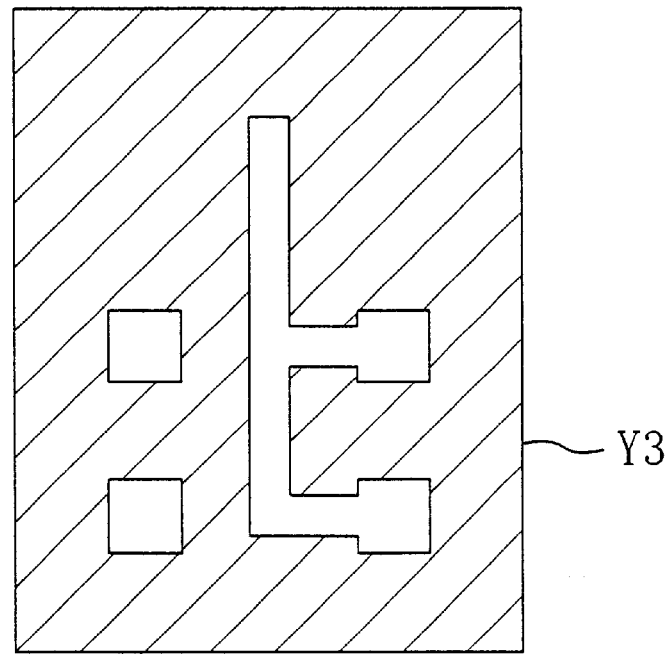
FIG. 11(b) is a plan view of a second photomask used for fabricating the semiconductor device of Embodiment 3.
Figure 12A:
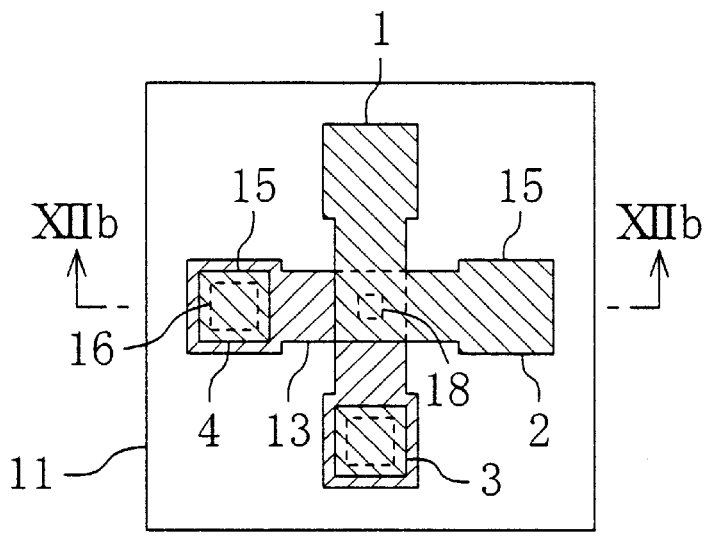
FIG. 12(a) is a plan view of a conventional semiconductor device.
Figure 12B:
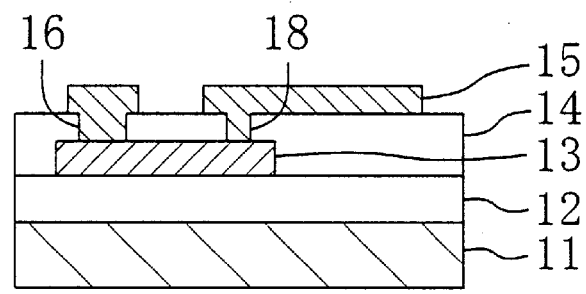
FIG. 12(b) is a cross-sectional view taken on line XIIb—XIIb of FIG. 12(a)
Figure 12C:
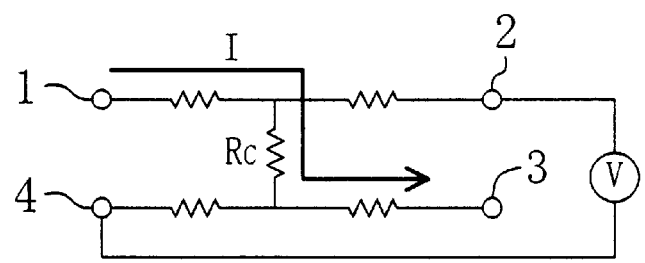
FIG. 12(c) is an equivalent circuit diagram of a semiconductor fabrication control monitor employed in the conventional technique and each embodiment of the invention.
Figure 13A:
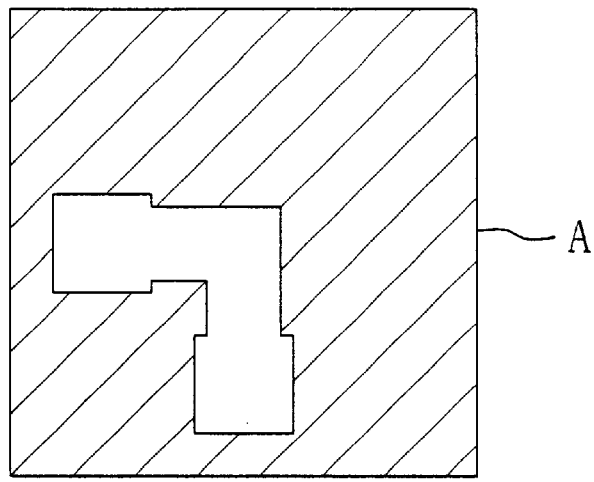
FIG. 13(a) is a plan view of a first photomask used for fabricating the conventional semiconductor device.
Figure 13B:
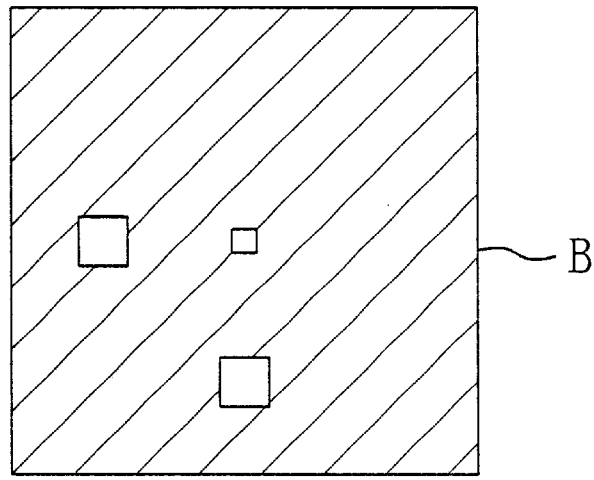
FIG. 13(b) is a plan view of a second photomask used for fabricating the conventional semiconductor device.
Figure 13C:
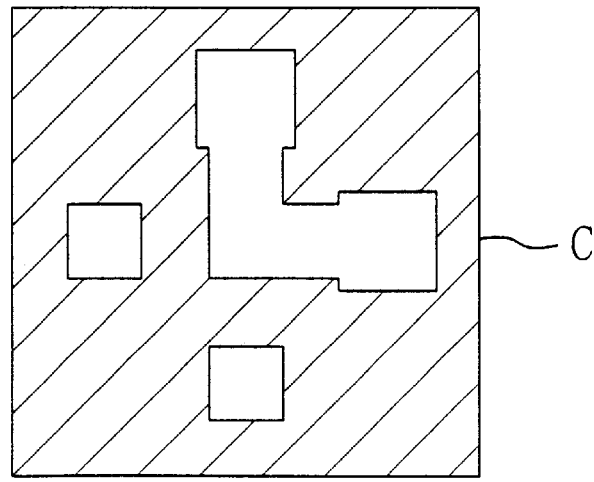
FIG. 13(c) is a plan view of a third photomask used for fabricating the conventional semiconductor device.
Figure 14A:
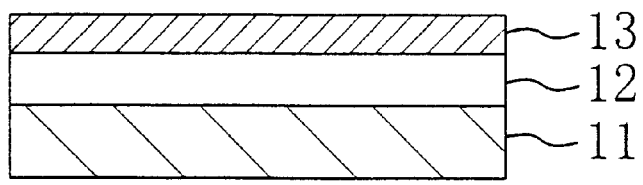
FIGS. 14(a), 14(b), 14(c), 14(d) and 14(e) are cross-sectional views for showing procedures in a method of fabricating the conventional semiconductor device.
Figure 14B:
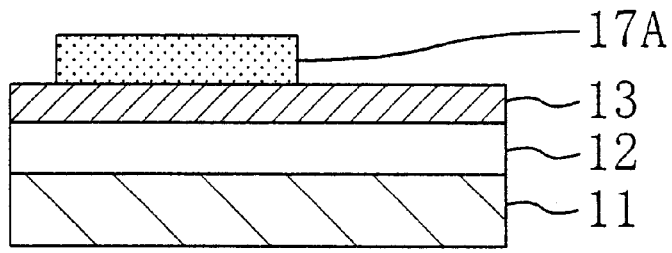
Figure 14C:
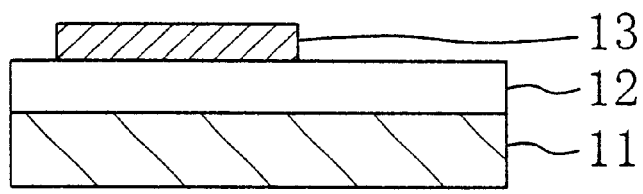
Figure 14D:
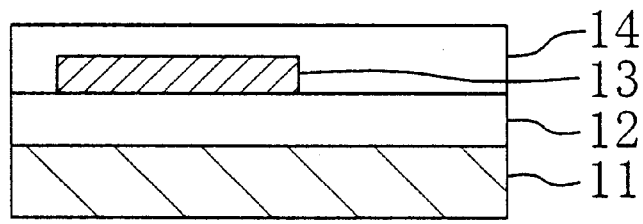
Figure 14E:
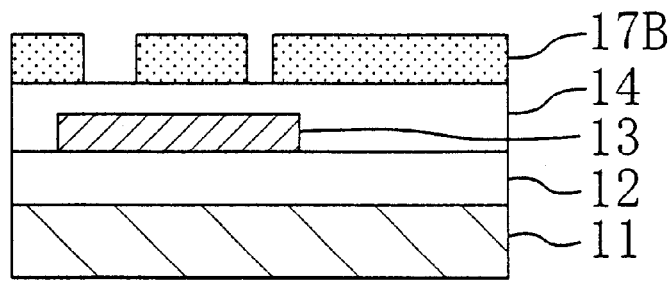
Figure 15A:
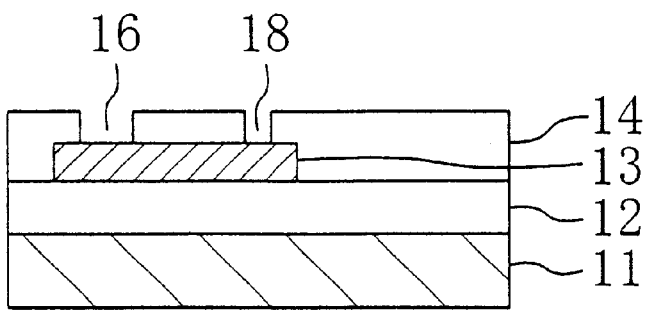
FIGS. 15(a), 15(b), 15(c) and 15(d) are cross-sectional views for showing other procedures in the method of fabricating the conventional semiconductor device.
Figure 15B:
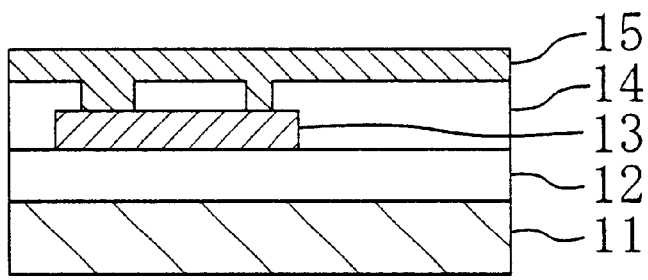
Figure 15C:
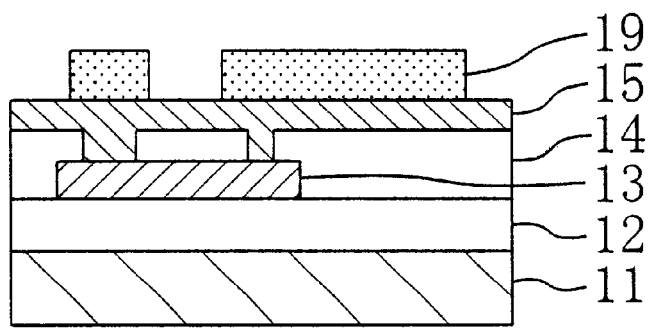
Figure 15D:
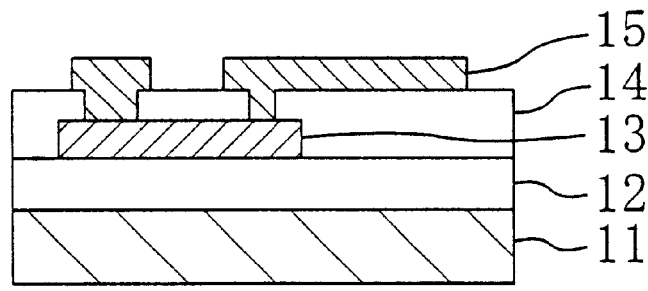

FIG. 11(a) shows the plane structure of a first photomask X3 used in the fabrication of the semiconductor device of Embodiment 3, and FIG. 11(b) shows the plane structure of a second photomask Y3 used in the fabrication of the semiconductor device of Embodiment 3.

As is shown in FIG. 11(a), the first photomask X3 has a shielding portion at the center of the area for the gate electrode, so that the second insulating film 303A having the opening can be formed on the polysilicon film 302A serving as the bottom gate electrode.

Accordingly, in Embodiment 3, in the area for the gate electrode, the second insulating film 303A having a slightly smaller plane shape than the polysilicon film 302A serving as the bottom gate electrode and having the opening at the center is formed between the polysilicon film 302A serving as the bottom gate electrode and the tungsten film 304A serving as the top gate electrode. Therefore, as is understood from FIGS. 10(a) and 10(d), the tungsten film 304A serving as the top gate electrode and a sidewall 304C are not electrically connected to each other. As a result, it is possible to definitely avoid the problem that the interface resistance value cannot be measured due to pattern shortcircuit.

Accordingly, in Embodiment 3, the pattern short-circuit can be avoided without conducting a procedure (such as wet etching) particularly necessary in etching the second insulating film 203A in Embodiment 2.

In Embodiment 3, a barrier metal film of tungsten nitride or titanium nitride is disposed between the patterned polysilicon film 302A (the polysilicon film serving as the bottom gate electrode) and the patterned tungsten film 304A (the tungsten film serving as the top gate electrode), but a laminated structure including the tungsten film and the barrier metal film is herein designated as the patterned tungsten film 304B (the tungsten film serving as the top gate electrode) for convenience.

What is claimed is:

1. A semiconductor device comprising a semiconductor fabrication control monitor for measuring a process characteristic of a semiconductor element formed on a semiconductor substrate, wherein said semiconductor fabrication control monitor includes:

a first conducting film formed on said semiconductor substrate and having a first area, a second area, a third area and a fourth area mutually connected through a first conducting film connecting part;

a first electrode of a second conducting film formed above said first area with an insulating film sandwiched therebetween;

a second electrode of said second conducting film formed above said second area with said insulating film sandwiched therebetween;

a second conducting film connecting part formed above said first conducting film connecting part with said insulating film sandwiched therebetween for connecting said first electrode and said second electrode;

a third electrode of said second conducting film formed above and in direct contact with said third area; and a fourth electrode of said second conducting film formed above and in direct contact with said fourth area, and said first electrode and said second electrode are electrically connected to said first conducting film.

2. The semiconductor device of claim 1, wherein said first conducting film is a polysilicon film doped with an impurity and said second conducting film is a metal film, and said semiconductor device further includes a gate electrode formed from a laminated structure including said first conducting film and said second conducting film.

3. A method of fabricating the semiconductor device of claim 1, comprising:

a first step of depositing said first conducting film on said semiconductor substrate;

a second step of depositing said insulating film on said first conducting film;

a third step of allowing said insulating film to remain in an area above said first area, an area above said second area and in an area above said first conducting film connecting part by patterning said insulating film with a first mask pattern used as a mask;

a fourth step of depositing said second conducting film on said first conducting film and said patterned insulating film; and a fifth step of forming said first electrode, said second electrode, said third electrode, said fourth electrode and said second conducting film connecting part from said second conducting film and forming said first area, said second area, said third area, said fourth area and said first conducting film connecting part from said first conducting film by patterning said second conducting film with a second mask pattern used as a mask and patterning said first conducting film with said second mask pattern and said patterned insulating film used as masks.

4. The method of fabricating the semiconductor device of claim 3, wherein said first conducting film is a polysilicon film doped with an impurity and said second conducting film is a metal film, and said fifth step includes a sub-step of forming a gate electrode from a laminated structure including said first conducting film and said second conducting film.

* * * * *